United States Patent [19]

Ohtsu et al.

[11] Patent Number: 5,745,370
[45] Date of Patent: Apr. 28, 1998

[54] ELECTROMAGNETIC FIELD INTENSITY CALCULATING DEVICE

[75] Inventors: Shinichi Ohtsu; Makoto Mukai; Sekiji Nishino; Kenji Nagase, all of Kawasaki, Japan

[73] Assignee: Fujitsu Limited, Kawasaki, Japan

[21] Appl. No.: 432,261

[22] Filed: May 1, 1995

[30] Foreign Application Priority Data

May 10, 1994 [JP] Japan .................................. 6-095364

[51] Int. Cl.$^6$ .................................................. H04B 17/00
[52] U.S. Cl. ........................ 364/488; 395/920; 455/67.3; 364/578
[58] Field of Search .................... 364/480, 481, 364/483, 488, 489, 490, 524, 550, 551.01, 556, 578; 324/200, 260, 534, 537, 750; 343/702, 703; 395/919, 920, 921; 455/67.1, 67.3

[56] References Cited

U.S. PATENT DOCUMENTS 4,933,889  6/1990  Meshkat et al. ........................ 364/578
5,270,647  12/1993  Beissner et al. ........................ 364/578 X

OTHER PUBLICATIONS

Printed Circuit Design, vol. 11, No. 1, pp. 11-12, Jan. 1994, Wang, Paul K.U., "Solving EMC/EMI Problems".

Primary Examiner—James P. Trammell
Assistant Examiner—Edward Pipala
Attorney, Agent, or Firm—Staas & Halsey

[57] ABSTRACT

An electromagnetic field intensity calculating device calculates according to a moment method the intensities of the electric field and the magnetic field radiated by an electric circuit device having metal portions and dielectric portions. The electromagnetic field intensity calculating device comprises an input unit for inputting the precise structure of the electric circuit device including the structure of the metal portions and the structure of the dielectric portions; a deriving unit for deriving simultaneous equations based on the structure of the electric circuit device input to the input unit, a calculating unit for calculating the electric current flowing through the metal portions and the equivalent electric current and the equivalent magnetic current flowing through the dielectric portions by solving the simultaneous equations; and a computation unit for calculating the intensity of the electric field and the magnetic field radiated by the electric circuit device based on calculation results obtained by the calculating unit.

12 Claims, 21 Drawing Sheets

FIG. 3

SOURCE LIBRARY 201

| WAVE SOURCE CIRCUIT FORMAT | RESISTANCE | CAPACI-TANCE | INDUCTANCE | ... |
|---|---|---|---|---|

LOAD LIBRARY 202

| LOAD CIRCUIT FORMAT | RESISTANCE | CAPACI-TANCE | INDUCTANCE | ... |
|---|---|---|---|---|

NETWORK LIBRARY 203

| FILTER CIRCUIT FORMAT | RESIST-ANCE | CAPACI-TANCE | INDUCTANCE | ... |
|---|---|---|---|---|

LIMIT LIBRARY 204

| NAME OF SPECIFICATION | FRE-QUENCY | ELECTRIC FIELD INTENSITY LIMIT VALUE | ... |
|---|---|---|---|

MATERIAL LIBRARY 205

| FREQUENCY | CONDUCTIVITY | RELATIVE DIELECTRIC CONSTANT | RELATIVE PERMEABILITY | ... |
|---|---|---|---|---|

CABLE LIBRARY 206

| CABLE TYPE | CHARACTERISTIC IMPEDANCE | DIAMETER OF CORE | THICKNESS | ... |
|---|---|---|---|---|

PACKAGE LIBRARY 207

| CAPACITY FORM | NUMBER OF PINS | INDUCT-ANCE | CAPACI-TANCE | ... |
|---|---|---|---|---|

END OF MONOPOLE $Z_0, Z_1$
CURRENT DIRECTION $Z_0 \rightarrow Z_1$
WAVE SOURCE POSITION $Z'$
MONOPOLE LENGTH $d \ (= Z_1 - Z_0)$ DISTANCE BETWEEN WAVE SOURCE AND CHECK POINT
$r = \sqrt{p^2 + (Z - Z')^2}$
$r_0 = \sqrt{p^2 + (Z - Z_0)^2}$
$r_1 = \sqrt{p^2 + (Z - Z_1)^2}$ CURRENT DISTRIBUTION
$J^+ = \dfrac{\sin k(d - Z' + Z_0)}{\sin kd}$ $J^- = \dfrac{\sin k(d + Z' + Z_1)}{\sin kd}$

FIG. 11

$$\begin{cases} E_{z+}(z,\rho) = -\dfrac{J\omega\mu}{4\pi k \sin kd}\left[\dfrac{\exp(-jkr_1)}{r_1} - \cos kd \dfrac{\exp(-jkr_0)}{r_0}\right. \\ \qquad\qquad \left. - J(z-z_0)\sin kd \dfrac{\exp(-jkr_0)}{r_0^2} - \dfrac{z-z_0}{k}\sin kd \dfrac{\exp(-jkr_0)}{r_0^3}\right] \\[1em] E_{\rho+}(z,\rho) = -\dfrac{J\omega\mu}{4\pi k\rho \sin kd}\left[-(z-z_1)\dfrac{\exp(-jkr_1)}{r_1} + (z-z_0)\cos kd \dfrac{\exp(-jkr_0)}{r_0}\right. \\ \qquad\qquad \left. + J(z-z_0)^2 \sin kd \dfrac{\exp(-jkr_0)}{r_0^2} - \dfrac{\rho^2}{k}\sin kd \dfrac{\exp(-jkr_0)}{r_0^3}\right] \end{cases}$$

FIG. 12

$$\begin{cases} E_{z-}(z,\rho) = -\dfrac{J\omega\mu}{4\pi k \sin kd}\left[\dfrac{\exp(-jkr_0)}{r_0} - \cos kd \dfrac{\exp(-jkr_1)}{r_1}\right. \\ \qquad\qquad \left. + J(z-z_1)\sin kd \dfrac{\exp(-jkr_1)}{r_1^2} - \dfrac{z-z_1}{k}\sin kd \dfrac{\exp(-jkr_1)}{r_1^3}\right] \\[1em] E_{\rho-}(z,\rho) = \dfrac{J\omega\mu}{4\pi k\rho \sin kd}\left[-(z-z_0)\dfrac{\exp(-jkr_0)}{r_0} + (z-z_1)\cos kd \dfrac{\exp(-jkr_1)}{r_1}\right. \\ \qquad\qquad \left. - J(z-z_1)^2 \sin kd \dfrac{\exp(-jkr_1)}{r_1^2} + \dfrac{\rho^2}{k}\sin kd \dfrac{\exp(-jkr_1)}{r_1^3}\right] \end{cases}$$

FIG. 13

| | ELECTRIC CURRENT SOURCE | MAGNETIC CURRENT SOURCE |
|---|---|---|
| ELECTRIC FIELD | $Ez^+, E\rho^+$ <br> $Ez^-, E\rho^-$ | $-H\phi^+$ <br> $-H\phi^-$ |
| MAGNETIC FIELD | $H\phi^+ = -\dfrac{1}{j4\pi \sin kd \, \rho}\left[\exp(-jkr_1) - \{\cos kd + j\sin kd \dfrac{z-z_0}{r_0}\}\exp(-jkr_0)\right]$ <br><br> $H\phi^- = -\dfrac{1}{j4\pi \sin kd \, \rho}\left[\exp(-jkr_0) - \{\cos kd - j\sin kd \dfrac{z-z_1}{r_1}\}\exp(-jkr_1)\right]$ | $\dfrac{\varepsilon}{\mu} Ez^+,\ \dfrac{\varepsilon}{\mu} E\rho^+$ <br><br> $\dfrac{\varepsilon}{\mu} Ez^-,\ \dfrac{\varepsilon}{\mu} E\rho^-$ |

FIG. 14A

$$\begin{bmatrix} Z^0{c,c} & Z^0{c,d} & B^0{c,d} \\ Z^0{d,c} & Z^0{d,d}+Z^a{d,d} & B^0{d,d}+B^a{d,d} \\ B^0{d,c} & B^0{d,d}+B^a{d,d}-Y^0{d,c} & -Y^a{d,d} \end{bmatrix} \begin{bmatrix} Ic,n \\ Id,n \\ Mn \end{bmatrix} = \begin{bmatrix} Vi \\ 0 \\ 0 \end{bmatrix}$$

FIG. 14B

$$\begin{bmatrix} \dfrac{Z^0{c,c}-ZL}{Z^0{d,c}} & Z^0{c,d} & B^a{c,d} \\ Z^0{d,c} & Z^0{d,d}+Z^a{d,d} & B^0{d,d}+B^a{d,d} \\ B^0{d,c} & B^0{d,d}+B^a{d,d}-Y^0{d,d} & -Y^a{d,d} \end{bmatrix} \begin{bmatrix} Ic,n \\ Id,n \\ Mn \end{bmatrix} = \begin{bmatrix} Vi \\ 0 \\ 0 \end{bmatrix}$$

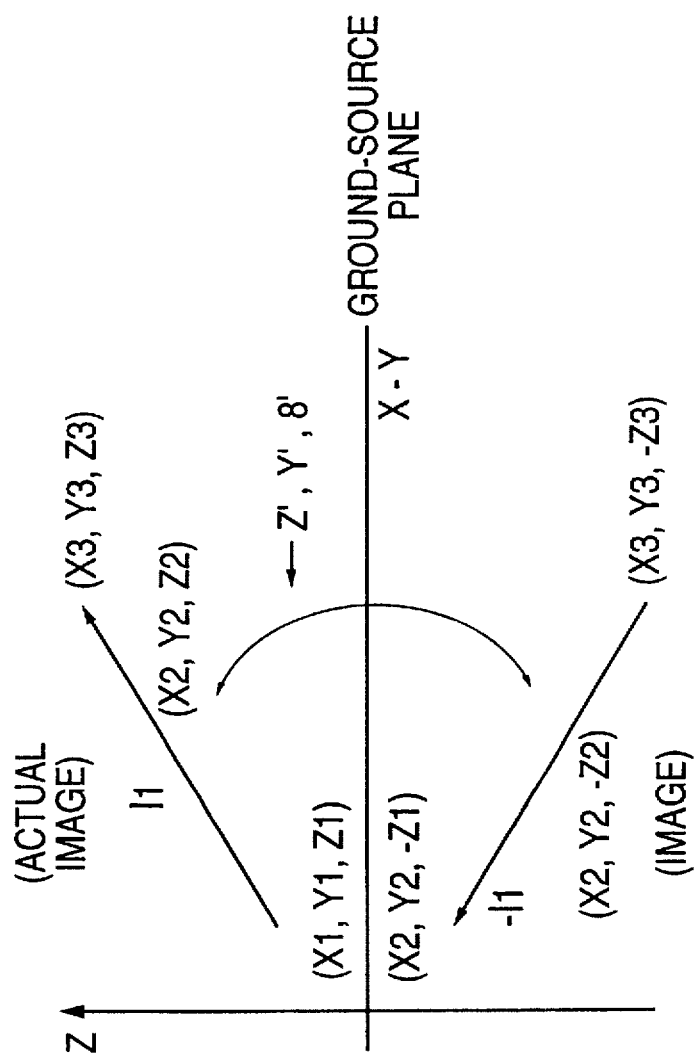

FIG. 16A $$[M] = \begin{bmatrix} Z^0{}_{c,c} & Z^0{}_{c,d} & B^0{}_{c,d} \\ Z^0{}_{d,c} & Z^0{}_{d,d} + Z^0{}_{d,d} & B^0{}_{d,d} + B^0{}_{d,d} \\ B^0{}_{d,c} & Z^0{}_{d,d} + B^0{}_{d,d} & -Y^0{}_{d,c} - Y^0{}_{d,d} \end{bmatrix}$$

FIG. 16B $$[M'] = \begin{bmatrix} Z^0{}_{c,c'} & Z^0{}_{c,d'} & B^0{}_{c,d'} \\ Z^0{}_{d,c'} & Z^0{}_{d,d'} + Z^a{}_{d,d'} & B^0{}_{d,d'} + B^a{}_{d,d'} \\ B^0{}_{d,c'} & B^0{}_{d,d'} + B^a{}_{d,d'} & -Y^0{}_{d,d'} - Y^a{}_{d,d'} \end{bmatrix}$$

FIG. 16C $$[[M] - [M']] \begin{bmatrix} I_{c,n} \\ I_{d,n} \\ M_n \end{bmatrix} = \begin{bmatrix} V_i \\ 0 \\ 0 \end{bmatrix}$$

ELECTROMAGNETIC FIELD RADIATION PATTERN

ELECTROMAGNETIC FIELD MAP

ELECTRIC CIRCUIT DEVICE

X-Y PLANE

ELECTROMAGNETIC FIELD INTENSITY CALCULATING DEVICE

BACKGROUND OF THE INVENTION

1. Field of the Invention

The present invention relates to an electromagnetic field intensity calculating device for calculating the intensity of the electric field and magnetic field radiated by an electric circuit device according to a moment method, and more specifically to an electromagnetic field intensity calculating device capable of calculating the electromagnetic field intensity with high precision.

2. Description of the Related Art

Since electric waves incidentally radiated from an electric circuit device interfere with other electric waves, for example of, television and radio receivers, they have recently been subject to strict control in many countries. For example, the VCCI standards are applied in Japan, the FCC standards in the US, and the VDE standards in Germany.

Various countermeasures using shielding technology, filtering technology, etc. are taken to meet the requirements of such standards. Consequently, quantitative simulation is required to know the exact reduction levels of the electric waves from using these technologies. Therefore, an electromagnetic field intensity calculating device capable of simulating with high precision the intensity of the electromagnetic field radiated by an electric circuit device is required.

The intensity of the electromagnetic field radiated by an object of any form can easily be calculated by a well-known logical equation for a given value of the electric current flowing through the object. The value of this electric current can be logically obtained under a boundary condition based on Maxwell's field equations. However, an appropriate logical solution for an object of an arbitrary form under complicated boundary conditions has not yet been defined.

Therefore, solutions for an electric current in the conventional electromagnetic field intensity calculating device all use approximation methods, regardless of the complexity of an object. Well-known approximation methods are a small loop antenna approximation method, a distributed constant line approximation method, and a moment method.

The small loop antenna approximation method processes the connection between a wave source circuit and a load circuit as a loop antenna. The electric current through the loop is assumed to be constant and is calculated by a calculation method of a lumped constant circuit. FIG. 23 shows a brief explanation of the small loop antenna approximation method.

The calculation according to the small loop antenna approximation method is the simplest of all, but is rarely used at present because the precision is exceedingly low when the length of the loop is not significant considering the wave length of the electromagnetic wave.

According to the distributed constant line approximation method, an electric current is calculated by applying a distributed constant line equation to an object which can be approximated as a one-dimensional structure. The calculation is relatively easy, the required calculation time and computer memory storage capacity only increase in proportion to the number of analysis elements, and phenomena including line reflections and resonances can be analyzed. Therefore, high-speed and high-precision analysis can be made on an object to which a one-dimensional approximation can be applied. FIG. 24 shows a brief explanation of the distributed constant line approximation method.

The calculation according to the distributed constant line approximation method achieves the high-speed and high-precision analysis on an object to which a one-dimensional structure approximation can be applied. However, this analysis cannot be made on an object to which this approximation cannot be applied.

On the other hand, the moment method is one of the solutions according to integral equations obtained by Maxwell's field equations, and processes a three-dimensional object of an arbitrary form. Practically, the object is divided into small elements to calculate the electric current.

In the conventional electromagnetic field intensity calculating device, the small loop antenna approximation method, distributed constant line approximation method, and the moment method, are applied to only a printed panel of an electric circuit device to calculate the intensity of the electromagnetic field radiated by the electric circuit device according to the electromagnetic wave radiated by the printed panel.

However, according to the conventional methods, since the electromagnetic wave radiated from the printed circuit board is scattered and amplified by cables, wires, or leads of the electric circuit device and is also scattered and interrupted by a metal box or other structures, an obtained electromagnetic field intensity considerably differs from a measured actual value.

SUMMARY OF THE INVENTION

The present invention has been made in view of the above described background, and aims to produce an electromagnetic field intensity calculating device for calculating the intensity of the electromagnetic field radiated by an electric circuit device with high precision according to the moment method.

The electromagnetic field intensity calculating device for calculating an intensity of an electric field and a magnetic field radiated by an electric circuit device comprising a metal portion and a dielectric portion according to the moment method. The electromagnetic field intensity calculating device comprises an input unit for inputting the precise structure of the electric circuit device including the structure of the metal portions and the structure of the dielectric portions; a deriving unit for deriving, based on the structure of the electric circuit device input by the input unit, simultaneous equations of the moment method in which unknowns are an electric current flowing through the metal portions, and an equivalent electric current and an equivalent magnetic current flowing through the dielectric portions; a calculating unit for calculating the electric current flowing through the metal portions, and the equivalent electric current and the equivalent magnetic current flowing through the dielectric portions, by solving the simultaneous equations of the moment method derived by the deriving unit; and a computation unit for calculating the intensity of the electric field and magnetic field radiated by the electric circuit device using the electric current, the equivalent electric current, and the equivalent magnetic current.

A method according to this invention is for calculating an electric field intensity and a magnetic field intensity radiated by an electric circuit device having a metal portion and dielectric portion, based on a moment method. The method includes; a first step of inputting a precise structure of the electric circuit device including a structure of the metal portion and a structure of the dielectric portion; a second step of deriving simultaneous equations in the moment method based on the structure of the electric circuit device input in the first step, an electric current flowing through the metal portion and an equivalent electric current and an equivalent magnetic current flowing through the dielectric portion being set as unknowns in the simultaneous equations; a third step of calculating the electric current, the equivalent electric current, and the equivalent magnetic current by solving the simultaneous equations derived in the second step; and a fourth step of calculating the electric field intensity and the magnetic field intensity radiated by the electric circuit device based on calculation results obtained in the third step.

BRIEF DESCRIPTION OF THE DRAWINGS

FIG. 3 shows the library data used in the embodiment of the present invention;

FIGS. 11, 12, and 13 show equations used in calculating the electric field intensity and the magnetic field intensity according to the embodiment of the present invention;

FIGS. 14A and 14B show simultaneous equations according to the moment method followed in the embodiment of the present invention;

FIG. 15 shows the reflected wave process performed according to the embodiment of the present invention;

FIGS. 16A, 16B, and 16C show the simultaneous equations according to the moment method followed in the embodiment of the present invention;

DESCRIPTION OF THE PREFERRED EMBODIMENT

Figure 1:
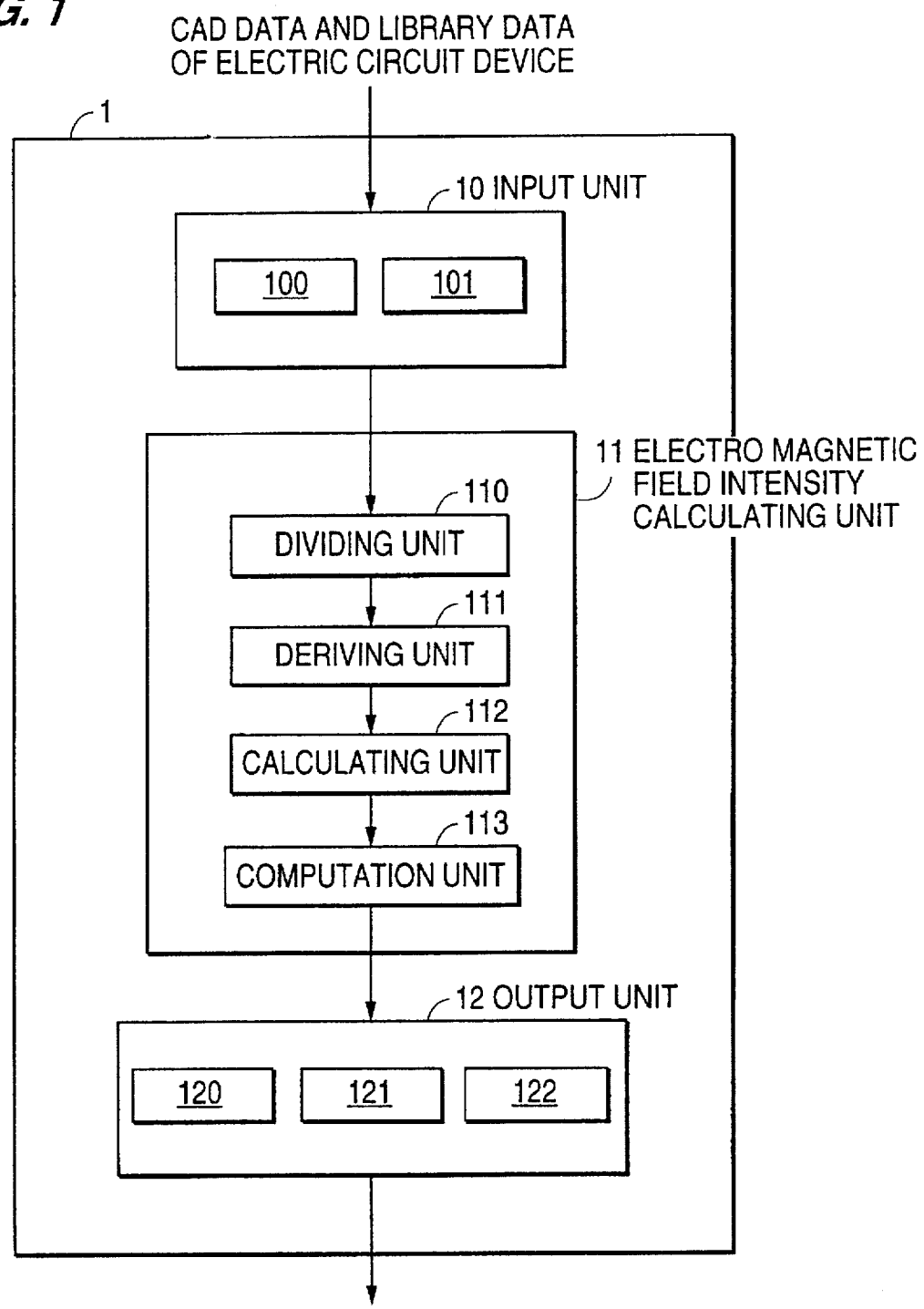
FIG. 1 shows a configuration of the electromagnetic field intensity calculating device according to the present invention.

An electromagnetic field intensity calculating device of the present embodiment calculates the intensity of the electromagnetic field radiated by an electric circuit device to be analyzed, according to the moment method. As shown in FIG. 1, the electromagnetic field intensity calculating device 1 comprises an input unit 10, an electromagnetic field intensity calculating unit 11, and an output unit 12.

The input unit 10 comprises a CAD data converting unit 100 for converting CAD data provided from an outside source, and a library data extracting unit 101 for extracting library data provided from an outside source, and inputs data indicating the structure of the electric circuit device to be analyzed.

The electromagnetic field intensity calculating unit 11 comprises a dividing unit 110 for dividing the structure of the electric circuit device into a mesh form using the data input by the input unit 10, a deriving unit 111 for deriving simultaneous equations according to the moment method depending on the structure of the electric circuit device divided by the dividing unit 110, a calculating unit 112 for solving the simultaneous equations according to the moment method derived by the deriving unit 111, and a computation unit 113 for calculating the intensity of the electric field and magnetic field radiated by the electric circuit device based on the value obtained by the calculating unit 112. With this configuration, the electromagnetic field intensity calculating unit 11 calculates the electric field intensity and magnetic field intensity (hereinafter referred to as the electromagnetic field intensity) radiated by the electric circuit device to be analyzed according to the moment method.

The output unit 12 comprises an electromagnetic field radiation pattern unit 120 for generating and illustrating an electromagnetic field radiation pattern according to the calculated electromagnetic field intensity, an electromagnetic field map unit 121 for generating an electromagnetic field map according to the calculated electromagnetic field intensity, and a frequency spectrum unit 122 for generating and illustrating a frequency spectrum according to the calculated electromagnetic field intensity, and outputs the result calculated by the electromagnetic field intensity calculating unit 11 in a graphic form.

The input unit 10 correctly inputs not only the structure of the printed circuit board of the electric circuit device to be analyzed, but also the structure of the metal portions and dielectric portions of the other components such as cables, leads, and a metal box, or the like, with precision. The printed circuit board in the description of the present embodiment refers to a circuit which by itself radiates an electromagnetic wave in the electric circuit device. In other words, the printed circuit board is a source of the electromagnetic wave. The description of cables, leads, and a metal box, includes similar parts used as the component parts of the electric circuit device.

When the structure of the electric circuit device to be analyzed is correctly entered, the dividing unit 110 divides the electric circuit device into a mesh form.

Then, the deriving unit 111 derives simultaneous equations according to the moment method in which unknown are the electric current flowing through the metal of the printed circuit boards, the electric current flowing through the cables (including the common mode current which is not an original transmission current but which flows on the surface of the metal so as to counteract the electric field on the metal surface), the electric current flowing through the leads (including the common mode current), the common mode current flowing on the surface of the metal box, and the equivalent electric current and equivalent magnetic current flowing on the surface of the dielectric portions of the printed circuit boards and other components. The deriving unit 111 derives the equation in consideration of the relationship between the divided printed circuit board and the divided cables, leads, and the metal box; the relationship between the divided cables and the divided printed circuit board, leads, and the metal box; the relationship between the divided leads and the divided printed circuit board, cables, and the metal box; and the relationship between the divided metal box and the divided printed circuit board, cables, and leads.

At this time, when the deriving unit 111 determines that an inductive core for achieving the reduction of the common mode electric current is attached to the cables according to the input data of the structure of the electric circuit device, it derives simultaneous equations according to the moment method in consideration of the effect of suppressing the common mode electric current as indicated by the inductive core. If the deriving unit 111 determines that the reflected wave of the ground surface should be taken into account according to the input data of the structure of the electric circuit device, then it generates a structure image which is regarded as a source of the reflected wave and derives the simultaneous equations according to the moment method, assuming that the electromagnetic current of the same intensity in the opposite direction to an electric current flowing through the real structure, is flowing in the structure image.

After the deriving unit 111 derives simultaneous equations according to the moment method, the calculating unit 112 calculates the electric current flowing through the metal of the printed circuit boards, the electric current flowing through the cables (including the common mode current), the electric current flowing through the leads (including the common mode current), the common mode current flowing on the surface of the metal box, and the equivalent electric current and equivalent magnetic current flowing on the surface of the dielectric portions of the printed circuit boards and other components, by solving the above described simultaneous equations. Using the calculation result, the computation unit 113 calculates the intensity of the electromagnetic field radiated by the electric circuit device.

The output unit 12 outputs the calculated electromagnetic field intensity in a graphic form using the electromagnetic field radiation pattern unit 120, electromagnetic field map unit 121, and/or the frequency spectrum unit 122.

Thus, the electromagnetic field intensity calculating device according to the present invention calculates the common mode electric current according to the moment method after recognizing that the common mode electric current flowing through the cables, leads, and the metal box, according to the electromagnetic wave radiated by the printed circuit board, becomes a new strong source of electromagnetic waves, and also calculates the intensity of the electromagnetic field radiated by the electric circuit device in consideration of the common mode electric current. Thus, it calculates the intensity of the electromagnetic field radiated by the electric circuit device with high precision.

The electromagnetic field intensity calculating device 1 according to the present invention receives an input of the exact structure of the electric circuit device to be analyzed. The input data includes mechanical CAD data of the electric circuit device to be analyzed, electrical CAD data of the electric circuit device, and library data of the electric circuit device.

Figure 2:
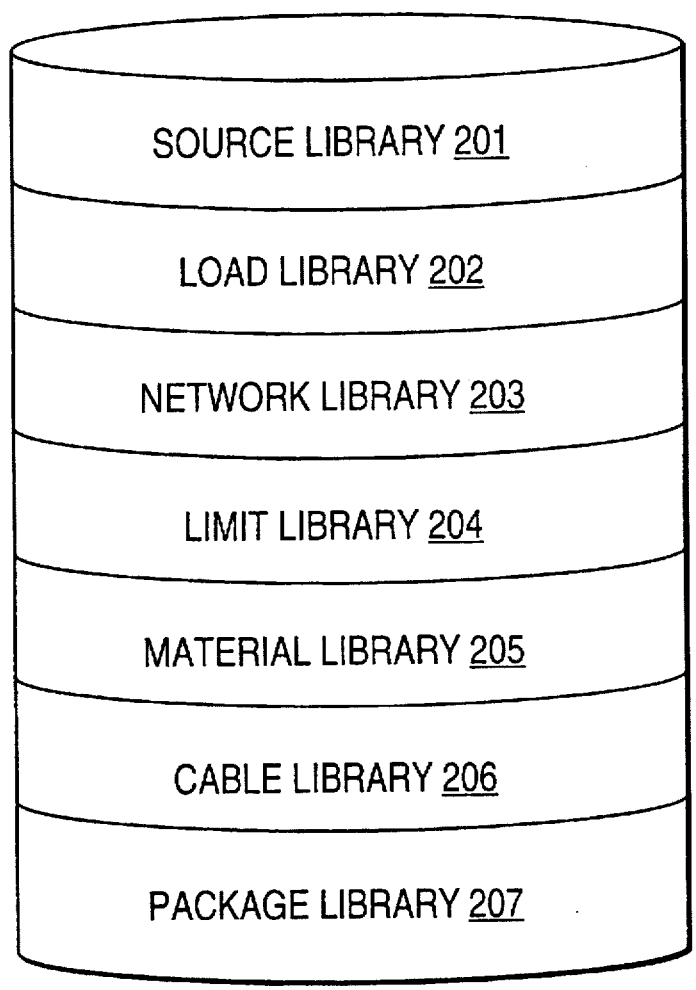
FIG. 2 shows the library data used in the embodiment of the present invention.

FIG. 2 shows an example of the data structure of library data 200 input to the electromagnetic field intensity calculating device 1. FIG. 3 shows an example of the detailed data structure of each library shown in FIG. 2.

As shown in FIG. 2, the library data 200 used in the present embodiment comprises a source library 201, a load library 202, a network library 203, a limit library 204, a material library 205, a cable library 206, and a package library 207. As shown in FIG. 3, each of the libraries 201 through 207 stores data about the features, characteristics, etc. of the components of the electric circuit device to be analyzed. Practically, the source library 201 stores information about the format (form), resistance, capacitance, inductance, etc. of a wave source circuit. The load library 202 stores information about the format (form), resistance, capacitance, inductance, etc. of a load circuit. The network library 203 stores information about the format (form), resistance, capacitance, inductance, etc. of a filter circuit. The limit library 204 stores information about the specification, corresponding frequency, conductivity, electric field intensity limit value, etc. of a limiter circuit. The material library 205 stores information about the corresponding frequency, relative dielectric constant, relative permeability, etc. of each component. The cable library 206 stores information about the type, characteristic impedance, the diameter of an inductive core, thickness, etc. of a cable. The package library 207 stores information about the form of, number of pins, inductance, capacitance, etc. of a package. Since the electromagnetic field intensity calculating device of the present invention receives an input of the exact structure of the electric circuit device to be analyzed using the libraries 201 through 207, the structure of a printed circuit board directly radiating an electromagnetic wave is entered as well as the structures of cables, leads, and wires of the electric circuit device; an inductive core attached to the cables, metal structures and boxes of the electric circuit device; the aperture of the metal box, and the ground surface related to the electric circuit device.

Such exact information should be entered because the electromagnetic wave radiated by the electric circuit device is not only directly radiated by a printed circuit broad, but is also radiated, even more strongly, by cables, leads, wires, metal structures, and metal boxes. Therefore, the above listed components are also analyzed.

Figure 4:
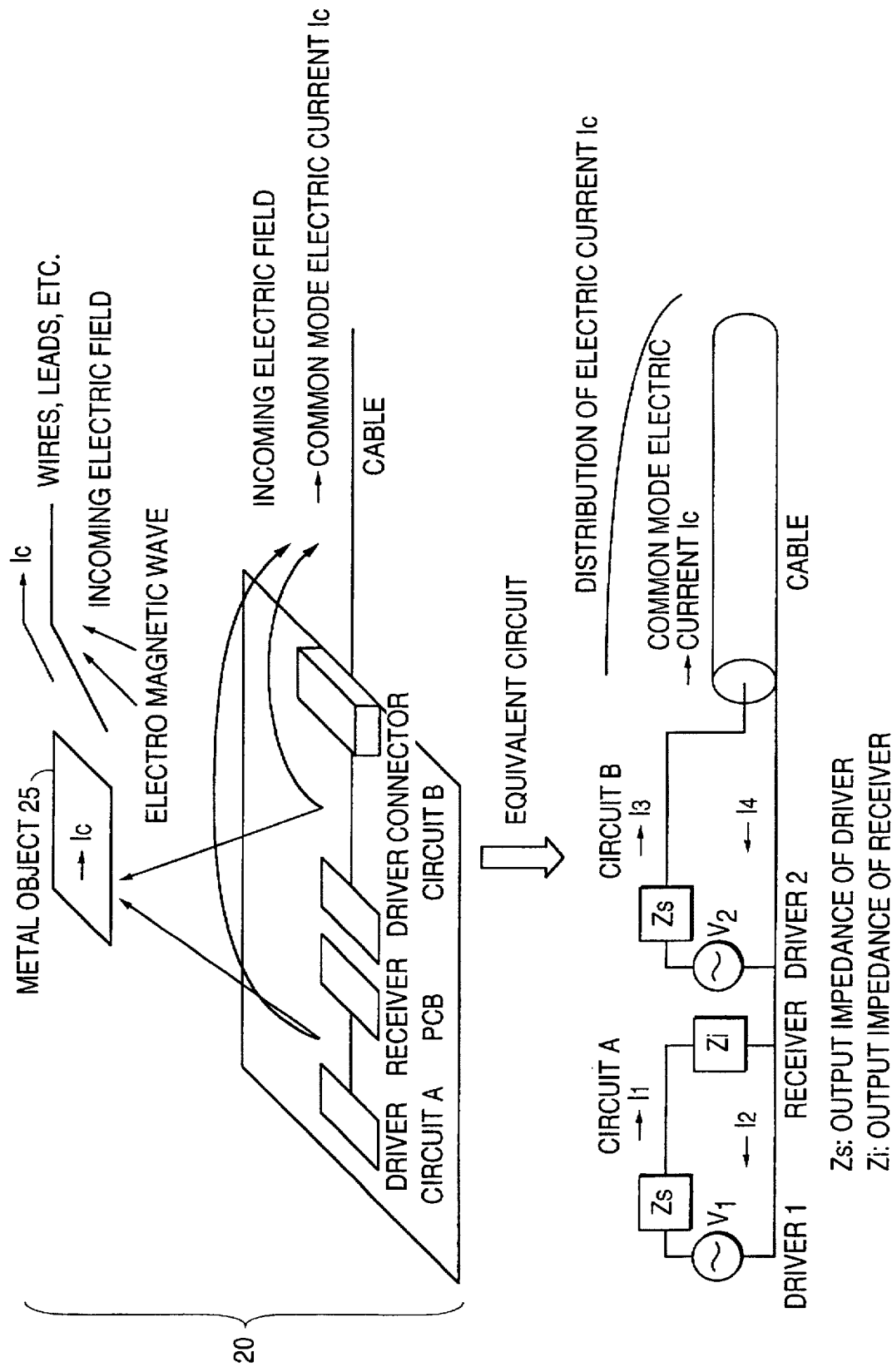
FIG. 4 shows the electric circuit device to be analyzed in the embodiment of the present invention.

That is, as shown in FIG. 4, the electromagnetic wave from circuits A and B of an electric circuit device 20 to be analyzed is radiated to a metal object 25 in the electric circuit device 20. A common mode electric current Ic flows on the surface of the metal object 25 so as to counteract the input electric field and to satisfy the boundary condition that the electric field on a metal surface is constantly zero. In consideration of the strong electromagnetic wave radiated by the common mode electric current, the exact structures of the metal objects other than the circuit itself are entered. According to the conventional electromagnetic field intensity calculating device, the metal object (through which a differential electric current flows) in the transmission line of the circuit is the only object to be analyzed, but the common mode electric current flowing on the surface of the metal object in a non-transmission line can not be analyzed.

The common mode electric current also flows through grounding cables, the shield portion of shielded cables, and twisted pair cables. That is, the common mode electric current flows through cables which have conventionally been regarded as components which do not radiate electromagnetic waves, and consequently the cables become strong radiating sources. All of these cables can be analyzed in the present invention.

Figure 5:
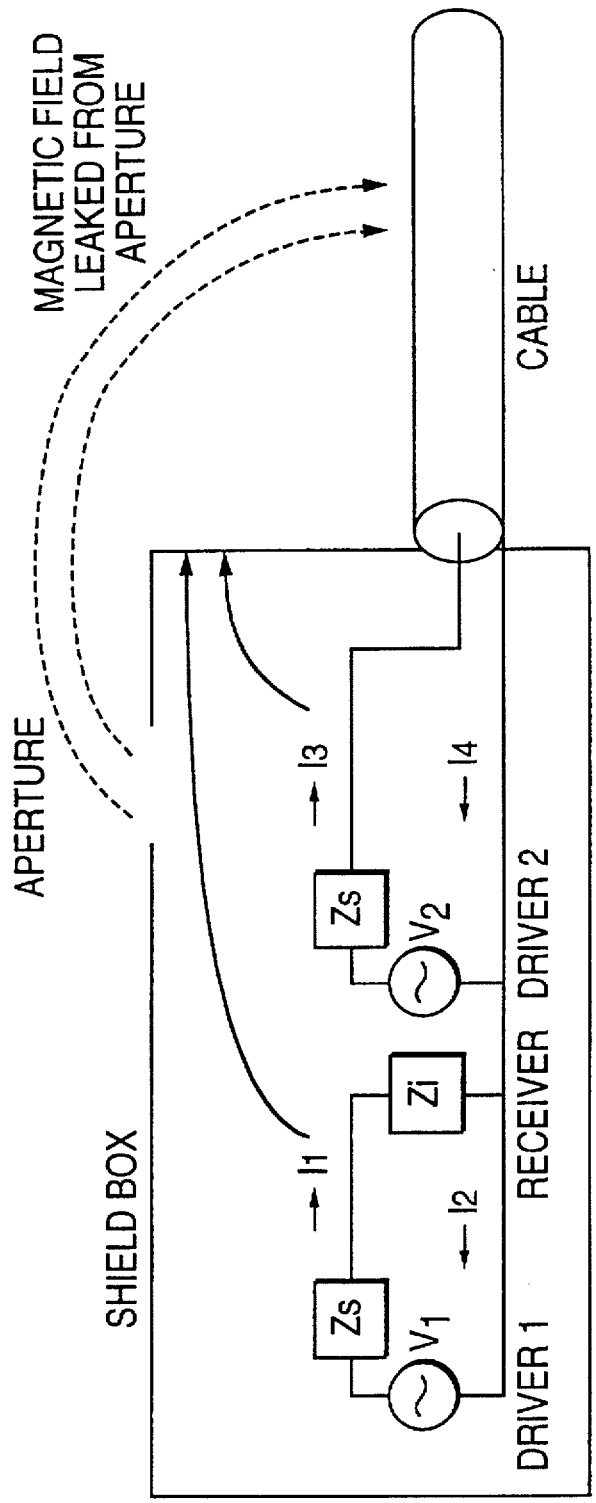
FIG. 5 shows the equivalent circuit of the electric circuit device to be analyzed in the embodiment of the present invention.

FIG. 5 shows an equivalent circuit of the electric circuit device to be analyzed in the present invention. The electric circuit device includes a shield box having an aperture.

When the electric circuit device includes a shield box, the electromagnetic wave is prevented from being radiated by the shield box. However, if the shield box has an aperture, a significant part of the electromagnetic wave leaks from this aperture.

The electromagnetic wave radiated from the device varies with the position and size of the aperture. Furthermore, the electromagnetic wave from the aperture changes the common mode electric current flowing through the cable to the outside, thereby further changing the electromagnetic wave radiation. Accordingly, the aperture should also be correctly analyzed. With the conventional electromagnetic field intensity calculating device, the influence of such an aperture of the shield box can not be analyzed. According to the present embodiment, the information about an aperture is entered and analyzed, and the exact electric field intensity and magnetic field intensity can be obtained using this information.

Figure 6:
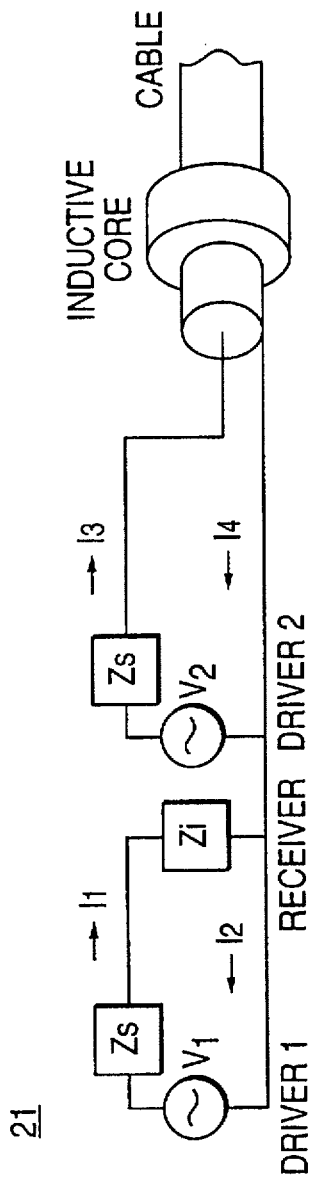
FIG. 6 shows the equivalent circuit of the electric circuit device to be analyzed in the embodiment of the present invention.

FIG. 6 shows an equivalent circuit 21 of an electric circuit device having a cable to which an inductive core is attached.

When an inductive core is attached to the cable of the electric circuit device, since the inductance or resistance of the inductive core reduces the common mode electric current flowing through the cable, the inductive core should also be analyzed.

If an inductive core is attached to the cable as shown in FIG. 6, then the inductance or resistance by the inductive core reduce the common mode electric current flowing through the cable, thereby changing the electromagnetic wave radiated from the device. Therefore, the precise data of the inductive core attached to the cable should also be exactly entered. The influence of the inductive core has not been considered in the conventional electromagnetic field intensity calculating device.

Since the information of the inductive core is entered and analyzed in the present embodiment, the exact electric field intensity and magnetic field intensity can be obtained using this information.

Figure 7:
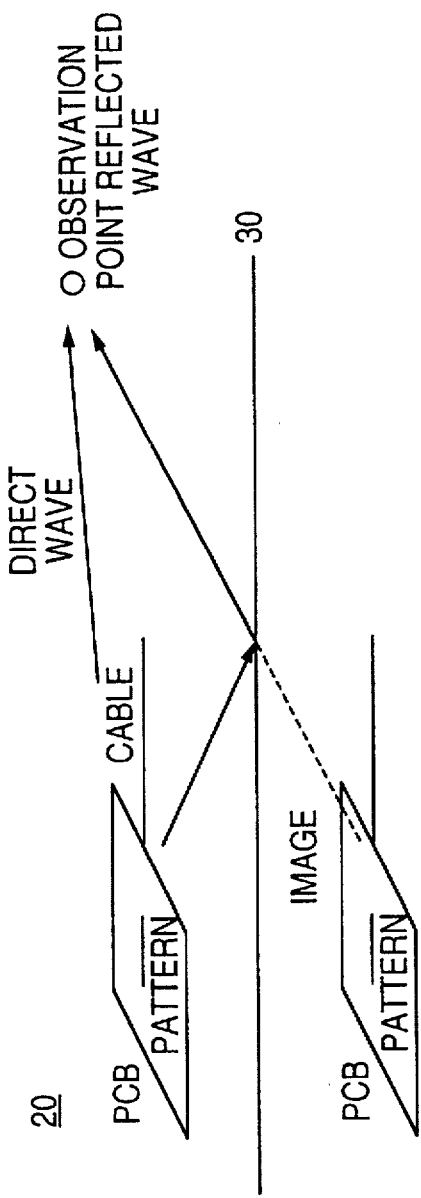
FIG. 7 shows the process performed when the electric circuit device is affected by the ground surface.

FIG. 7 shows the process when the electric circuit device is affected by the ground surface.

When the electric circuit device 20 is affected by the reflection from the ground surface, the reflected wave should also be analyzed.

If the electromagnetic field intensity calculating device is placed near the ground surface 30 as shown in FIG. 7, then a reflected wave is generated by the ground surface 30, thereby altering the electromagnetic wave radiated from the electric circuit device 20. Therefore, the influence of the ground surface 30 should be considered. The influence of the ground surface can not be analyzed in the conventional electromagnetic field intensity calculating device.

According to the present embodiment, the precise information of the electric circuit device 20 including the ground surface 30 is input to the input unit 10. When it is necessary to make an analysis including the reflected wave from the ground surface 30, a structure image regarded as a source of the reflected wave is generated instead of the ground surface 30, and simultaneous equations according to the moment method are derived assuming that an electric current of the same intensity in the opposite direction to an electric current flowing through the actual image (a component in the device 20) is flowing in the structure image. Therefore, the exact electric field intensity and magnetic field intensity are obtained based on the analysis including the ground surface 30.

FIGS. 8, 9A, 9B, and 9C show examples of a division by the dividing unit 110 into a mesh form.

Figure 8:
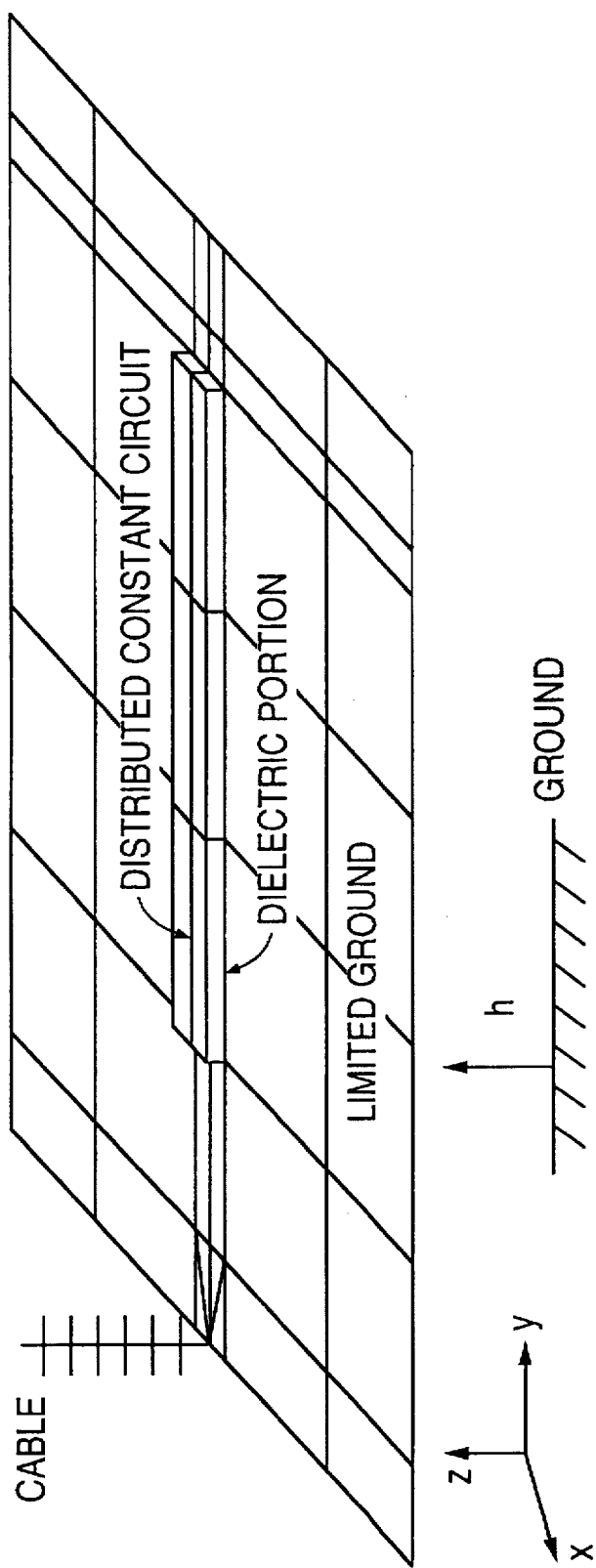
FIGS. 8, 9A, 9B, and 9C show examples of a mesh division made in the embodiment of the present invention.

If the exact data of the structure of the electric circuit device to be analyzed is entered, then the dividing unit 110 of the electromagnetic field intensity calculating unit 11 in the electromagnetic field intensity calculating device 1 first divides the structure of the entered electric circuit device 20 into a mesh form as shown in FIG. 8.

Figure 9A:
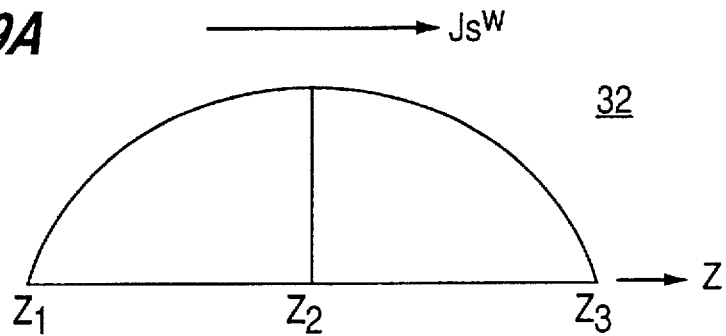
Figure 9B:
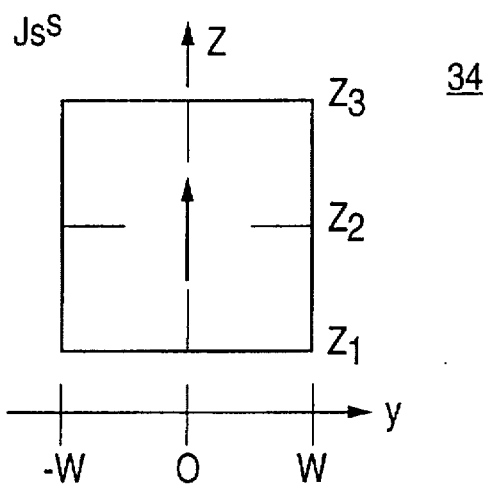
Figure 9C:
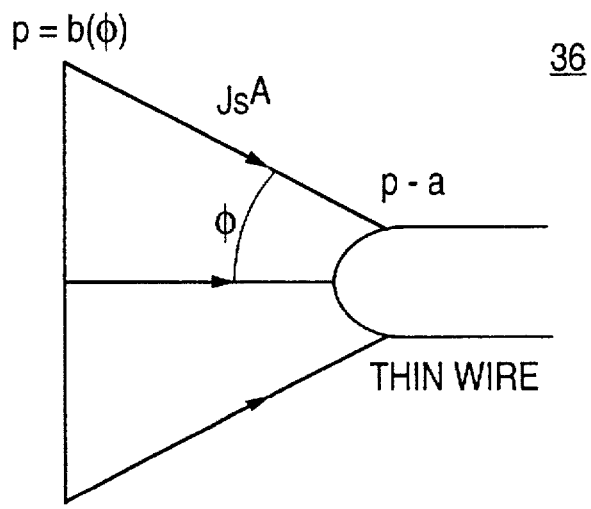

For example, a wire dipole 32 is generated as shown in FIG. 9A by dividing metal wire (cables). A surface patch dipole 34 is generated as shown in FIG. 9B by dividing the surface of the metal or dielectric portions. An attachment dipole 36 is generated as shown in FIG. 9C by radially dividing the surface of the metal which is a connecting portion between a metal wire and a metal surface. The connecting portion is radially divided because a high precision analysis can be made by dividing the connecting portion according to a pattern of a flow of the electric current.

An expansion function J shown by the following equation (1) and (1)' is used for the wire dipole 32, the electromagnetic field intensity calculating unit 11. In these equations (1) and (2), an identifier q indicates whether the condition is set in air or in a dielectric (q=0 represents the condition in air and q=d represents the condition in a dielectric), k represents the value of $2\pi$ divided by wave length $\lambda (2\pi/\lambda)$, Z with an arrow is a unit vector in the z direction, and a indicates the radius of the wire.

$$J_S{}^w = \frac{\vec{z}}{2\pi a} \frac{\sin k^q (Z - Z_1)}{\sin k^q (Z_2 - Z_1)} \quad (1)$$

$$Z_1 \leq Z \leq Z_2$$

$$J_S{}^w = \frac{\vec{z}}{2\pi a} \frac{\sin k^q (Z_3 - Z)}{\sin k^q (Z_3 - Z_2)} \quad (1)'$$

$$Z_2 \leq Z \leq Z_3$$

The electric current Js flowing through the metal electric wire is expanded into Nc sets of expansion functions using the expansion function J as shown by the following equation (2).

$$J_S = \sum_{n=1}^{Nc} I_n J_n \quad (2)$$

In the equation (2), the coefficient In indicates the value of the electric current and finally is processed as an unknown in the simultaneous equations according to the moment method.

Expansion functions J and K shown by the equations (3) and (3)' (J indicates an expansion function of an electric current, and K indicates an expansion function of a magnetic current) are assumed for the surface patch dipole 34 of the metal and dielectric generated as described above.

$$J_S{}^s = K_S{}^s = \vec{z} \frac{\sin k^q (Z - Z_1) \cos ky}{2\sin k^q (Z_2 - Z_1) \sin kw} \quad (3)$$

$$Z_1 \leq Z \leq Z_2$$

$$J_S{}^s = K_S{}^s = \vec{z} \frac{\sin k^q (Z_3 - Z) \cos ky}{2\sin k^q (Z_3 - Z_2) \sin kw} \quad (3)'$$

$$Z_2 \leq Z \leq Z_3$$

If the electric current flowing on the surface of the metal, and the equivalent electric current flowing on the surface of dielectric are shown by Js, and the equivalent magnetic current flowing on the surface of the dielectric is shown by Ms, the electric current Js is expanded into Nc sets of expansion functions as represented by equation (2) and the equivalent magnetic current Ms is expanded into Nd sets of expansion functions as represented by the following equation (4) using the expansion functions J and K.

$$Ms = \sum_{n=1}^{Nd} MnKn \quad (4)$$

In the equation (4), the coefficient In indicates the value of the electric current and is finally processed as an unknown in the simultaneous equations according to the moment method, and the coefficient Mn indicates the value of the magnetic current and is ultimately processed as an unknown in the simultaneous equations according to the moment method.

The equivalent electric current and the equivalent magnetic current are represented by the following equations using an actual magnetic field (H) and an actual electric field (E) on the surface of the structure, where $\bar{n}$ indicates a direction vector in the outer direction perpendicular to the surface of the structure.

Equivalent Electric Current $\bar{J} = \bar{n} \cdot \bar{H}$

Equivalent Magnetic Current $\bar{M} = \bar{n} \cdot \bar{E}$

Assume expansion function J expressed by the following equation (5) (where ρ with an arrow indicates a unit vector in the ρ direction) for the metal attachment dipole 36 thus generated.

$$Js^A = \vec{\rho} \frac{\sin k^q (b - \rho)}{2\pi\rho \sin k^q (b - a)} \quad (5)$$

$$a \leq \rho \leq b$$

If the electric current flowing through the metal attachment is shown by Js, the electric current Js is expanded into Nc sets of the expansion functions as shown by equation (2), using the expansion function J. In this case, In indicates the value of the electric current, and is finally processed as an unknown in the simultaneous equations according to the moment method.

Then, the electromagnetic field intensity calculating unit 11 calculates the mutual impedance $Z^O_{c,c}$ between divided metal portions, the mutual impedance $Z^O_{c,d}$, $Z^O_{d,c}$ between a divided metal portion and a dielectric portion, the mutual impedance $Z^O_{d,d}$, $Z^d_{d,d}$ between divided dielectric portions, the mutual admittance $Y^O_{d,d}$, $Y^d_{d,d}$ between divided dielectric portions, the mutual reaction (reactance) $B^O_{c,d}$,$B^O_{d,c}$ between a divided metal portion and a dielectric portion, and the mutual reaction (reactance) $B^O_{d,d}$, $B^d_{d,d}$ between divided dielectric portions.

The superscript O indicates a calculated value in air, and the superscript d indicates a calculated value in dielectric portions. The subscript c indicates a metallic portion. The subscript d indicates a dielectric portion. The subscript c,c indicates the metal-to-metal relationship. The subscript d,d indicates the dielectric-to-dielectric relationship. The subscript c,d indicates the dielectric-to-metal relationship. The subscript d,c indicates the metal-to-dielectric relationship.

If the electric field applied to mesh v by the electric current of the m-th expansion function of mesh u is represented by $E^q (J_u, m)$, then the mutual impedance between the electric current of the m-th expansion function of mesh u and the electric current of the n-th expansion function of mesh v is represented by the following equation (6).

$$Z^q u, v, mn = - \int \int_{Svn} Jv, n \cdot E^q (Ju, m) ds \quad (6)$$

Thus, the mutual impedance can be obtained by the equation (6).

If the magnetic field applied to mesh v by the magnetic current of the m-th expansion function of mesh u is represented by $H^q (K,m)$, then the mutual admittance between the magnetic current of the m-th expansion function of mesh u and the magnetic current of the n-th expansion function of mesh v is represented by the following equation (7).

$$Y^q d, d, mn = - \int \int_{Sdn} Kn \cdot H^q (K, m) ds \quad (7)$$

Thus, the mutual admittance can be obtained by the equation (7).

If the magnetic field applied to mesh v by the electric current of the m-th expansion function of mesh u is represented by $H^q (J_u, m)$, then the mutual reaction between the electric current of the m-th expansion function of mesh u and the magnetic current having the n-th expansion function of mesh v is represented by the following equation (8).

$$B^q u, v, mn = - \int \int_{Svn} Kn \cdot H^q (Ju, m) ds \quad (8)$$

Thus, the mutual reaction can be obtained by the equation (8).

If the electric field applied to mesh v by the magnetic current of the m-th expansion function of dielectric mesh u is represented by $E^q (K,m)$, then the mutual reaction between the magnetic current of the m-th expansion function of dielectric mesh u and the electric current of the n-th expansion function of mesh v is represented by the following equation (9).

$$B^q d, v, mn = - \int \int_{Svn} Jn \cdot E^q (K, m) ds \quad (9)$$

Thus, the mutual reaction can be obtained by the equation (9).

Figure 10:
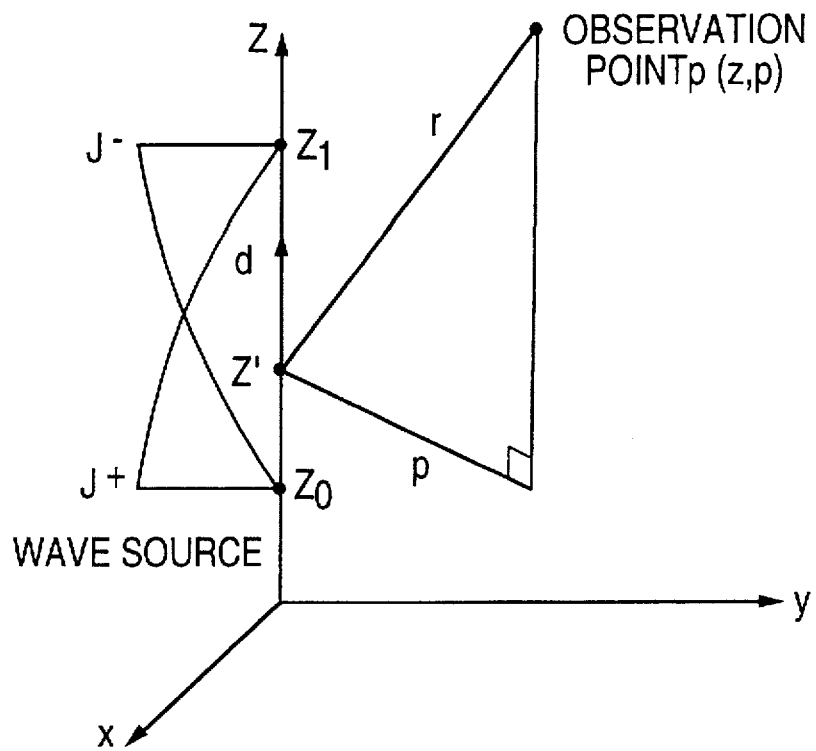
FIG. 10 shows a wave source and an observation point used in the calculation according to the embodiment of the present invention.

In the above described calculation process, it is necessary to calculate the electric and magnetic fields applied to a mesh by the electric and magnetic currents flowing through another mesh. When the relationship between the wave source and the check point and the electric current $J^+$ and $J^-$ are as shown in FIG. 10, the z-direction component $Ez^+$ and the ρ-direction component $E\rho^+$ of the electric field applied by the electric current $J^+$ are calculated by the equation shown in FIG. 11, the z-direction component $Ez^-$ and the ρ-direction component $E\rho^-$ of the electric field applied by the electric current $J^-$ are calculated by the equation shown in FIG. 12, and the magnetic field $H\phi^+$ applied by the electric current $J^+$ and the magnetic field $H\phi^-$ applied by the electric current $J^-$ are calculated by the equation shown in FIG. 13.

The electric field applied by the magnetic current $K^+$ indicating the same function form as the electric current $J^+$ is calculated based on $-H\phi^+$. The electric field applied by the magnetic current $K^-$, indicating the same functional form as the electric current $J^-$, is calculated based on $-H\phi^-$. The magnetic field applied by the magnetic current $K^+$ is calculated by the equation shown in FIG. 13 using the values $Ez^+$ and $E\rho^+$. The magnetic field applied by the magnetic current $K^-$ is calculated by the equation shown in FIG. 13 using the values $Ez^-$ and $E\rho^-$.

Thus, the mutual impedances, mutual admittances, and mutual reactions are calculated. Then, the electromagnetic field intensity calculating unit 11 derives the simultaneous equations according to the moment method shown in FIG. 14A using the wave source $V_i$ which exists on the printed circuit board; the coefficient $I_{c,n}$ indicating the value of the electric current flowing through divided metal portions; the coefficient $I_{d,n}$ indicating the value of the equivalent electric current flowing on the surface of divided dielectric portions; and the coefficient $M_n$ indicating the value of the equivalent magnetic current flowing on the surface of divided dielectric portions.

$$[Z^o{}_{c,c}] [Ic,n] + [Z^o{}_{c,d}] [Id,n] + [B^0{}_{c,d}] [Ma] = [Vi] \quad (10)$$

$$[Z^o{}_{d,c}] [Ic,n] + [Z^o{}_{d,d} + Z^d{}_{d,d}] [Id,n] + \quad (11)$$
$$[B^0{}_{d,d} + B^d{}_{d,d}] [Mn] = [0]$$

$$[B^o{}_{d,c}] [Ic,n] + [B^o{}_{d,d} + B^d{}_{d,d}] [Id,n] + \quad (12)$$
$$[-Y^o{}_{d,d} - Y^d{}_{d,d}] [Mn] = [0]$$

The equations (10), (11), and (12) in the simultaneous equations in the matrix shown in FIG. 14A, are respectively the equation derived under the boundary condition that the electric field value is 0 on the metal surface; the equation derived under the boundary condition that the tangent components of the electric field are the same on both sides of the boundary of the dielectric portions; and the equation derived under the boundary condition that the tangent components of the magnetic field are the same at both sides of the boundary of the dielectric portions.

When an inductive core is attached to a cable to reduce the common mode electric current, the electromagnetic field intensity calculating unit 11 derives the simultaneous equations according to the moment method by subtracting the impedance ZL of the inductive core from the mutual impedance $Z^O{}_{c,c}$ of the cable as indicated by the matrix shown in FIG. 14B.

If there is a ground surface which generates a reflected wave, then a structure image assumed to generate the reflected wave is formed as shown in FIG. 15, and then a magnetic current −Il having the same value in the opposite direction to the electric current Il flowing through an actual image is assumed for the structure image. In FIG. 15, it is assumed that ground surface exists on the X-Y plane and the image and the actual image are symmetrical with respect to the X-Y plane. Then, after calculating a matrix of the actual images according to the moment method shown in FIG. 16A and a matrix of the images and the actual images shown in FIG. 16B, simultaneous equations according to the moment method shown in FIG. 16C are derived.

If the above reflected wave process in which an electric current having an opposite polarity to an actual image electric current is applied to an image current, then a total calculation time only becomes approximately twice as long because there is no increase in the number of unknowns. By contrast, if the image electric current is processed as an unknown, then unknowns double in number, requiring a total calculation time approximately 4 times as long. Thus, the reflected wave process can realize a high-speed calculation.

When the simultaneous equations according to the moment method are derived, the electromagnetic field intensity calculating unit 11 solves the simultaneous linear equations to calculate the electric current flowing through the metal portions of a printed circuit board, the equivalent electric current and equivalent magnetic current flowing on the surface of the dielectric portions of the printed circuit board, the electric current (including the common mode electric current) flowing through cables, wires, and leads, and the common mode electric current flowing through metal cases and metallic structures.

Using the calculated electric current, equivalent electric current, and equivalent magnetic current, the electromagnetic field intensity calculating unit 11 calculates the intensity of the electromagnetic field radiated by the electric circuit device according to the equations shown in FIGS. 10 through 13. That is, the intensity of the electromagnetic field radiated by the electric circuit device is calculated taking into consideration the intensity of the electromagnetic field radiated by the common mode electric current, which can not be taken into account in the conventional methods.

Figure 17A:
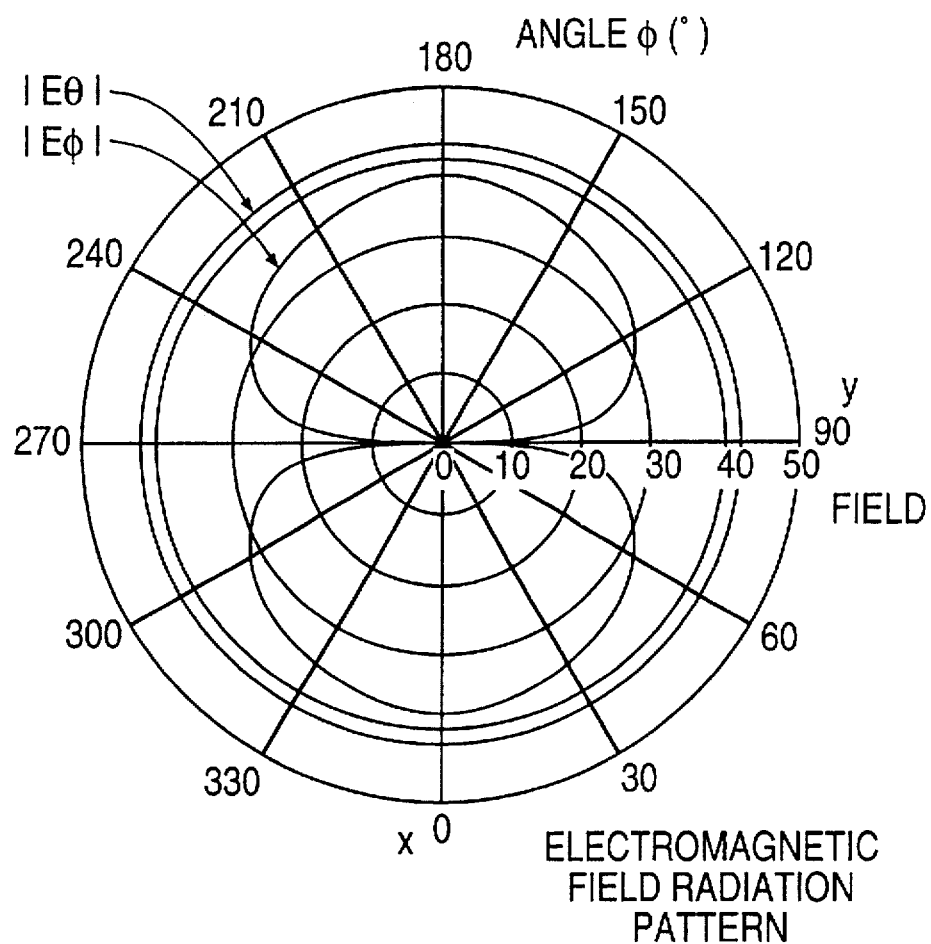
FIGS. 17A and 17B show the electromagnetic field radiation pattern and the electromagnetic field map output by the embodiment of the present invention.
Figure 17B:
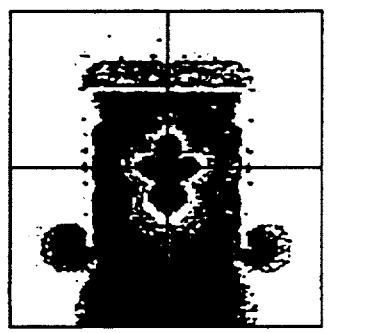
Figure 18:
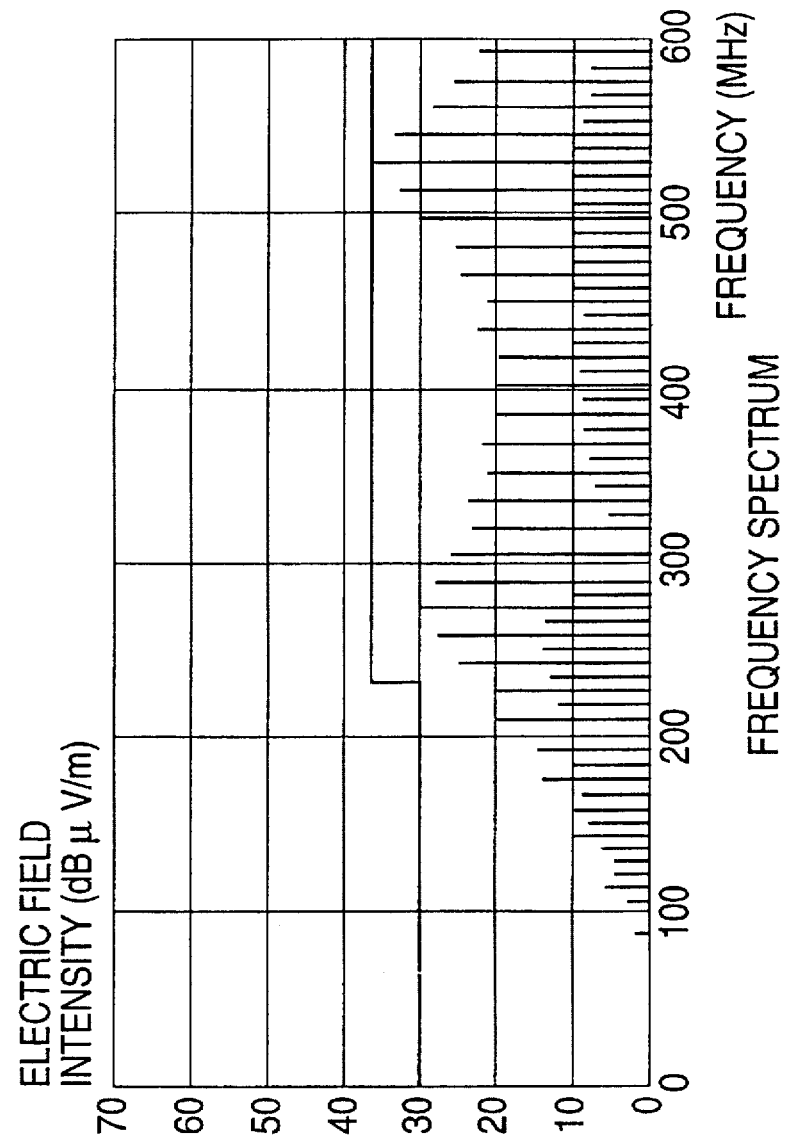
FIG. 18 shows the frequency spectrum output by the embodiment of the present invention.

When the intensity of the electromagnetic field radiated by the electric circuit device is calculated according to the above described calculation process performed by the electromagnetic field intensity calculating unit 11, the output unit 12 of the electromagnetic field intensity calculating device 1 generates and outputs an electromagnetic field radiation pattern indicating the radial electromagnetic field intensity as shown in FIG. 17A through the electromagnetic field radiation pattern unit 120, generates and outputs an electromagnetic field map indicating the electromagnetic field intensity using light and shade indication as shown in FIG. 17B through the electromagnetic field map unit 121, and generates and outputs a frequency spectrum in a graphic format of a frequency distribution of the electromagnetic field intensity as shown in FIG. 18 through the frequency spectrum unit 122.

Finally, the results of a simulation performed to verify the validity of the present invention are described by referring to FIGS. 19 through 22.

Figure 19A:
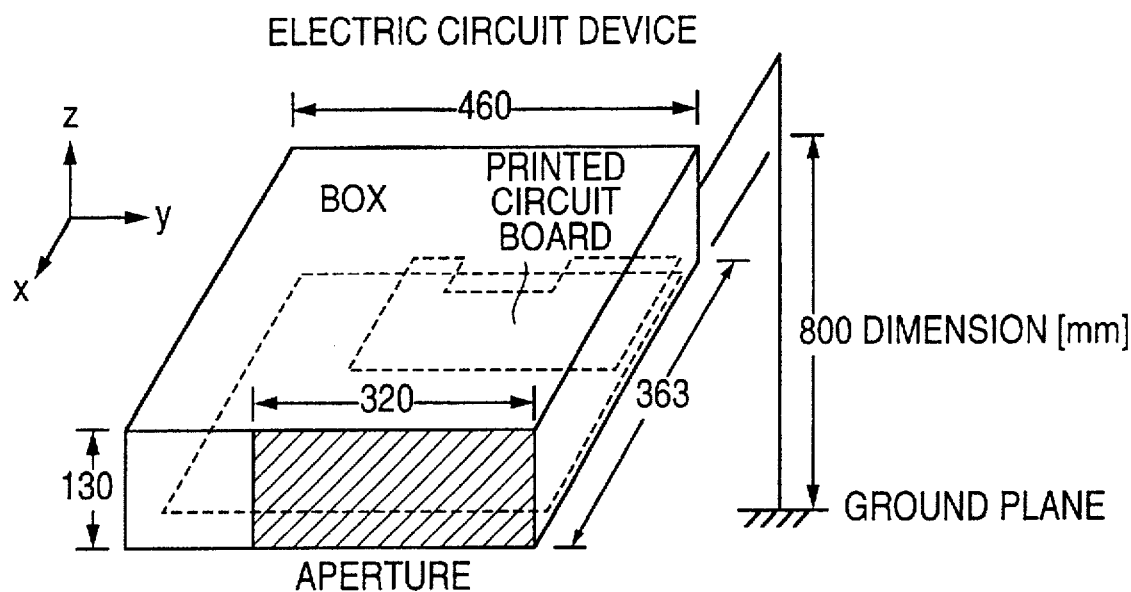
FIGS. 19A, 19B, 20A, 20B, 21, and 22 show the simulation of the embodiment of the present invention.

In this simulation, an electric circuit device having the mechanical structure and size shown in FIG. 19A is analyzed. The electric circuit device is composed of a box having an aperture illustrated as a diagonally shaded area and a printed circuit board enclosed by the box.

Figure 19B:
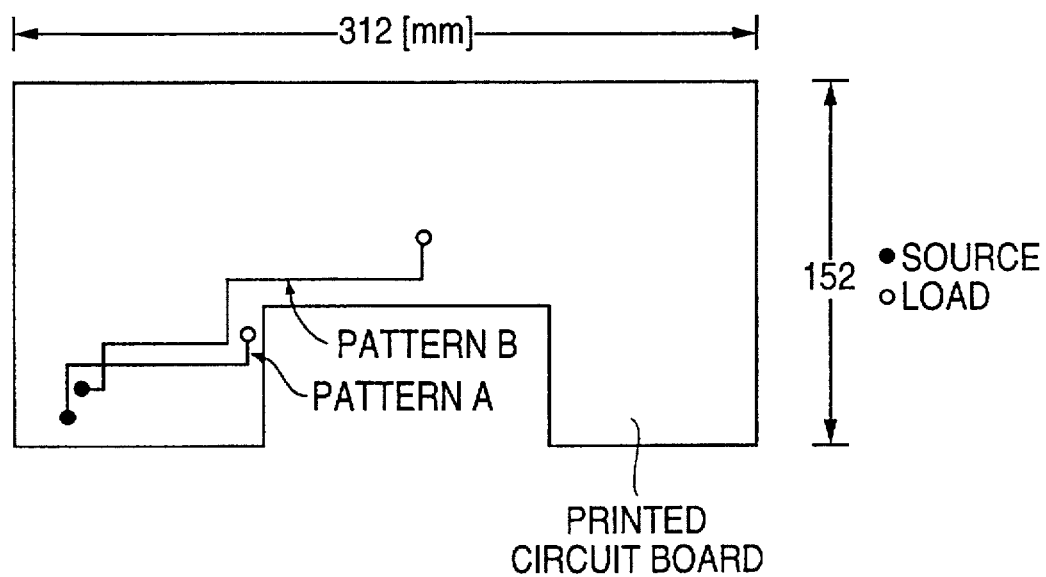

FIG. 19B shows the form and size of the printed circuit board.

Figure 20A:
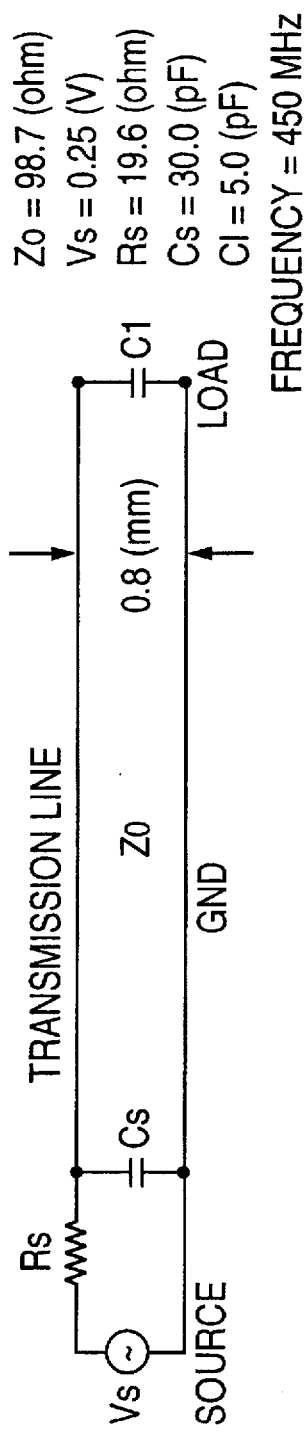
Figure 20B:
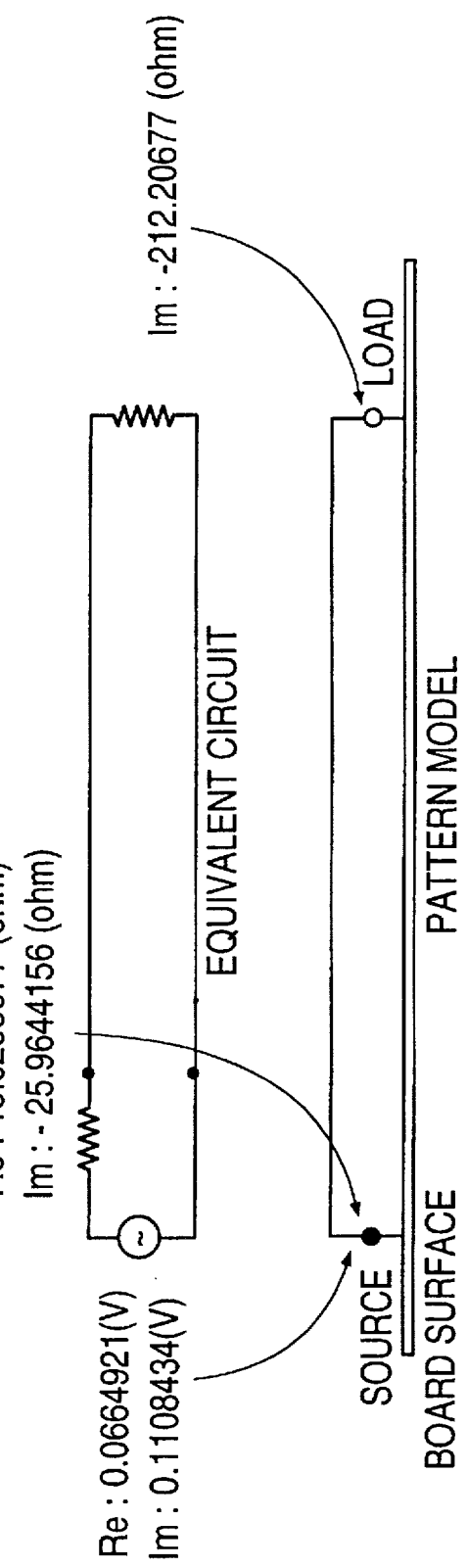
Figure 21:
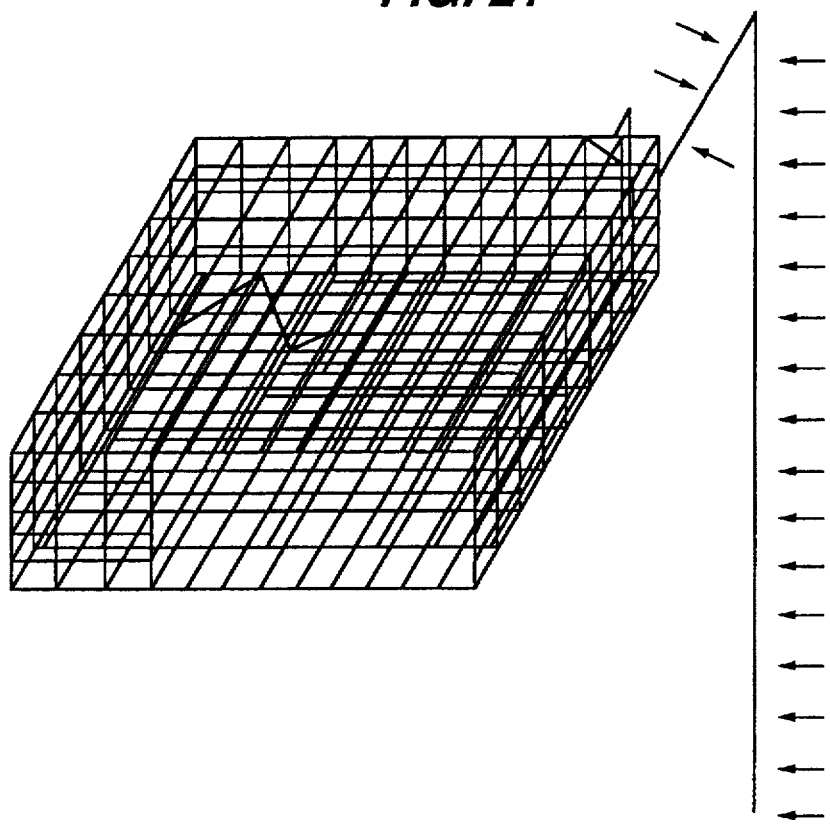

The printed circuit board of the electric circuit device has two clock patterns of the circuit configuration shown in FIG. 20A. The circuit configuration is converted into the equivalent circuit shown in FIG. 20B and is divided into a mesh form (wires: 295, surface patches: 464, and unknowns: 1066) as shown in FIG. 21.

Figure 22:
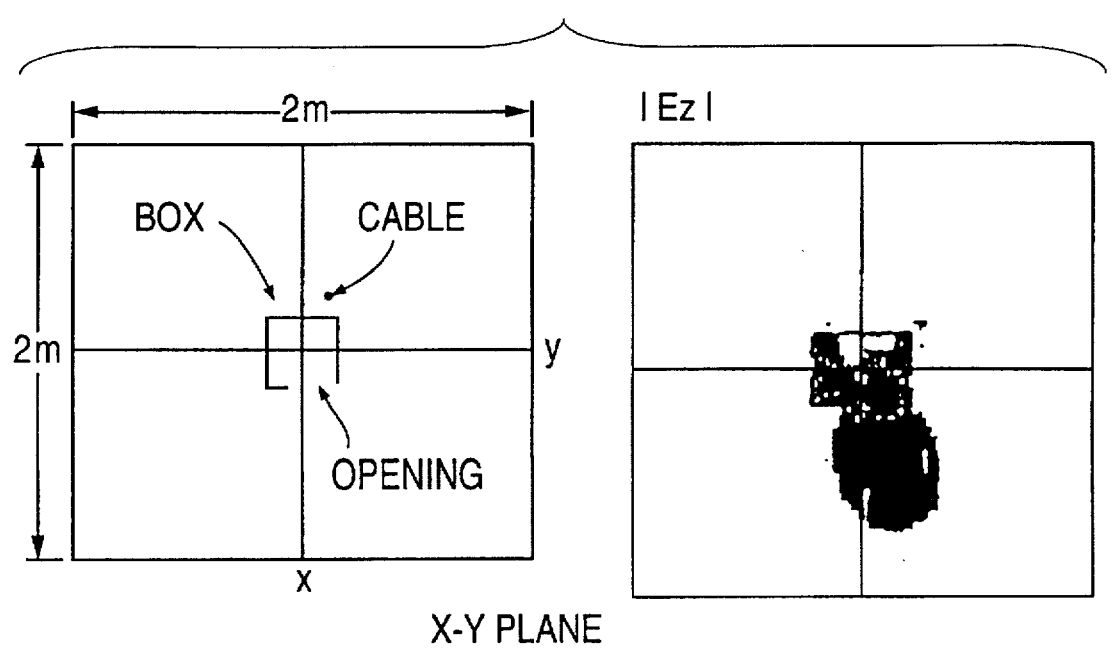
Figure 23:
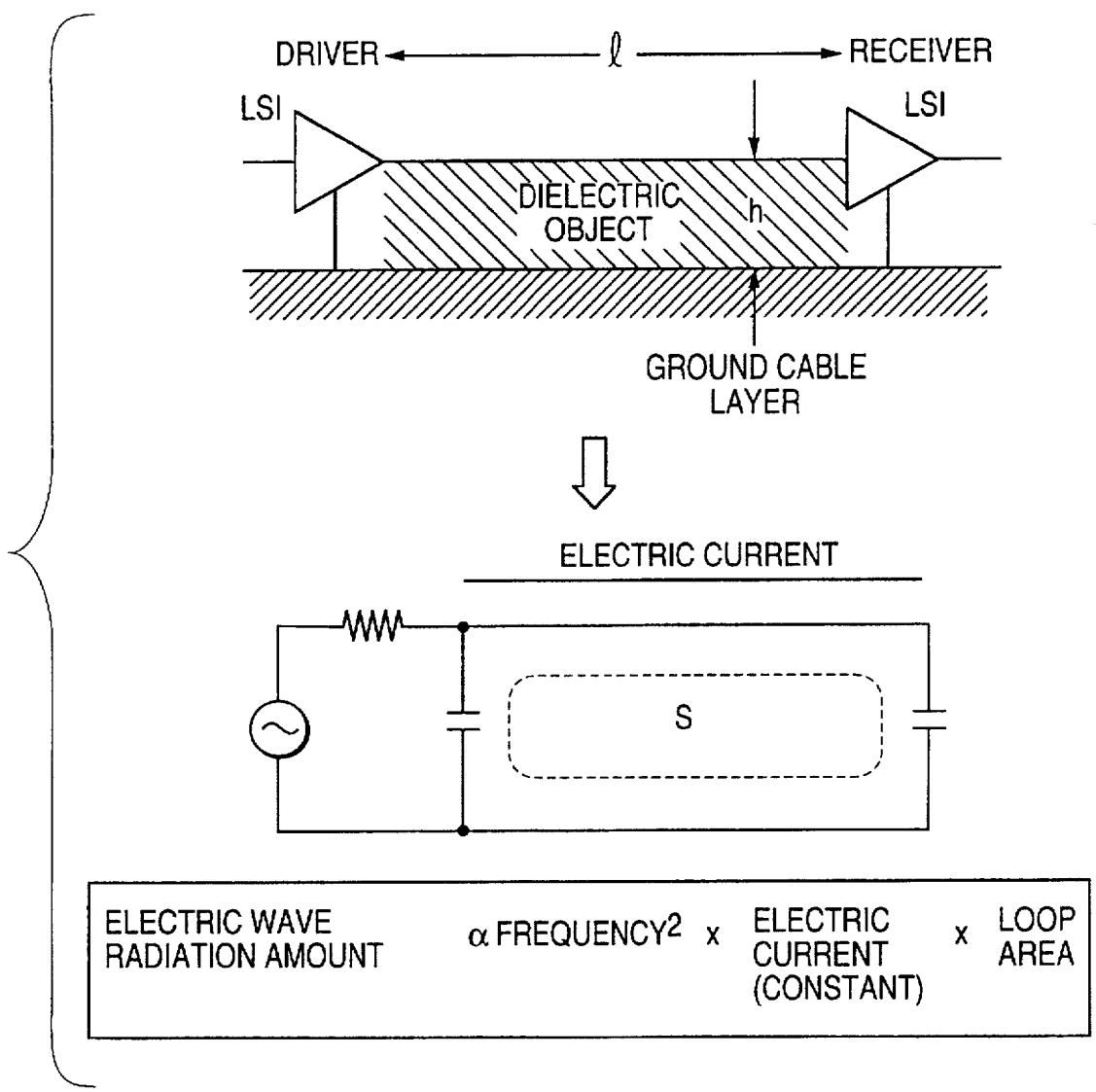
FIG. 23 shows the small loop antenna approximation method.
Figure 24:
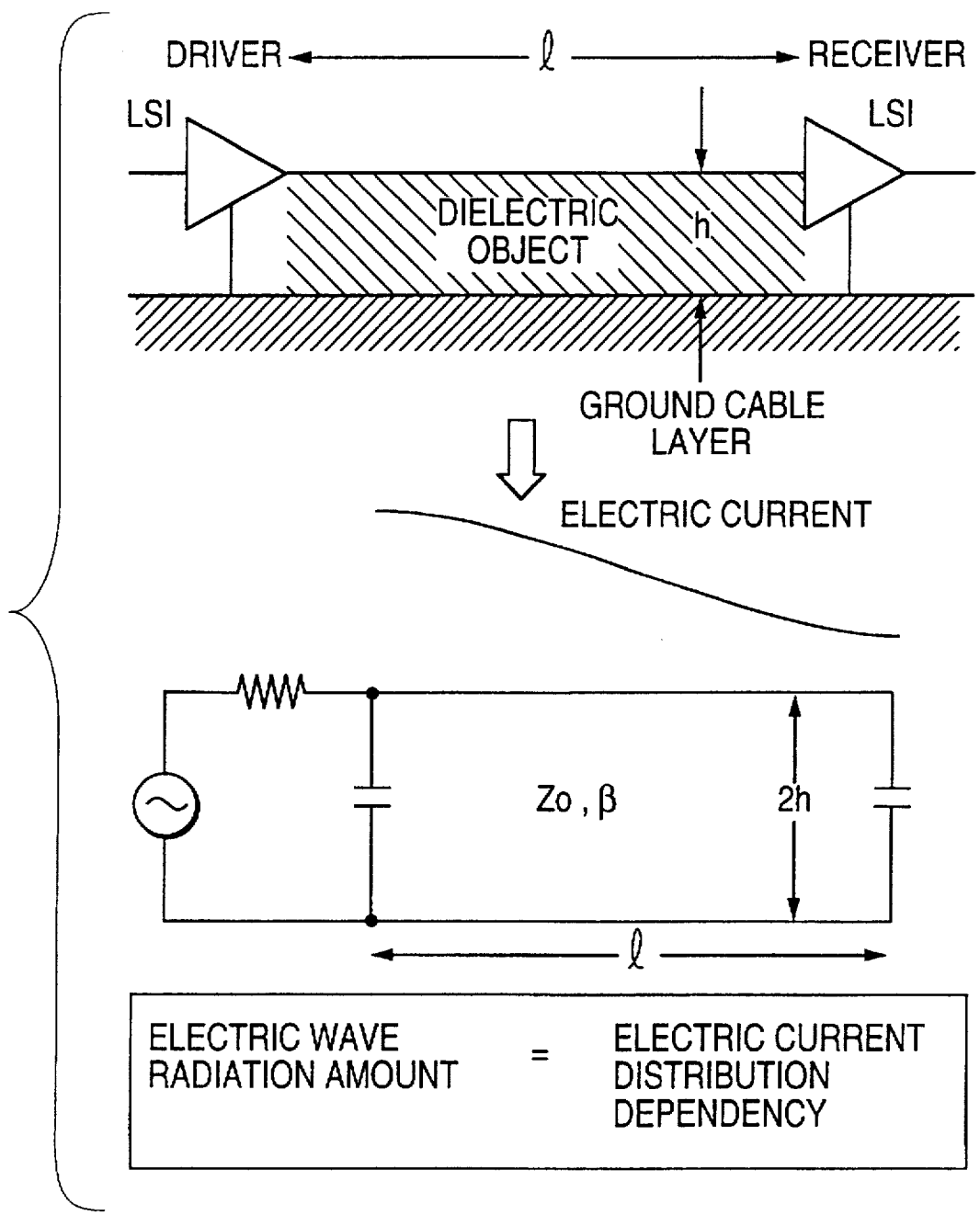
FIG. 24 shows the distributed constant line approximation method.

FIG. 22 shows the electromagnetic field map generated in the simulation. The height of the observation point is 0.865 m. Since the electromagnetic map is originally illustrated using various colors, the density of the map of FIG. 22, which is only illustrated in black and white, does not clearly show the real electromagnetic field intensity.

As shown in the electromagnetic field map, the leakage of electromagnetic waves from the aperture of the box and the radiation of electromagnetic waves from grounding cables connected externally to the box can be simulated by the present embodiment. The electromagnetic field intensity shown in the electromagnetic field map matches actual values with high precision.

As described above, the intensity of the electromagnetic field radiated by an electric circuit device can be calculated with high precision by considering the intensity of the electromagnetic field radiated by the common mode electric current flowing through metallic portions other than the printed circuit board.

In addition, the function of reducing the intensity of the electromagnetic field radiated by an inductive core attached to a cable and the influence on the electromagnetic field intensity by the ground surface can be evaluated numerically at a high speed.

What is claimed is:

1. An electromagnetic field intensity calculating device for calculating at least one of an electric field intensity and a magnetic field intensity radiated by an electric circuit device having a metal portion and a dielectric portion based on a moment method, comprising:

input means for inputting structure information on a printed circuit board and components of the electric circuit device affecting the electromagnetic field of the electric circuit device including structure information of the metal portion and structure information of the dielectric portion with precision;

deriving means for deriving simultaneous equations according to the moment method based on the structure information of the electric circuit device input to said input means, an electric current flowing through the metal portion and an equivalent electric current and an equivalent magnetic current flowing through the dielectric portion being set as unknowns in the simultaneous equations;

calculating means for calculating the electric current, the equivalent electric current and the equivalent magnetic current by solving the simultaneous equations derived by said deriving means; and computation means for calculating at least one of the electric field intensity and the magnetic field intensity radiated by the electric circuit device based on calculation results obtained by said calculating means.

2. The electromagnetic field intensity calculating device according to claim 1, further comprising:

output means for outputting in a graphic format at least one of the electric field intensity and the magnetic field intensity obtained by said computation means.

3. The electromagnetic field intensity calculating device according to claim 1, wherein said deriving means derives the simultaneous equations according to the moment method in consideration of an electric current suppressing effect generated by an inductive core if said deriving means determines that the inductive core is attached to a cable contained in the electric circuit device based on the structure of the electric circuit device input to said input means.

4. The electromagnetic field intensity calculating device according to claim 1, wherein when a wave reflected by a ground surface should be taken into account, said deriving means derives the simultaneous equations by generating a structure image for the wave and assuming for the structure image an electric current having same value and opposite direction to an electric current flowing in the electric circuit device.

5. The electromagnetic field intensity calculating device according to claim 1, further comprising:

dividing means for dividing in mesh form the structure of the electric circuit device input to said input means and deriving the simultaneous equations based on the structure of the electric circuit device divided in the mesh form by said dividing means.

6. A method for calculating at least one of an electric field intensity and a magnetic field intensity radiated by an electric circuit device having a metal portion and a dielectric portion based on a moment method comprising:

inputting structure information on a printed circuit board and components of the electric circuit device affecting the electromagnetic field of the electric circuit device including structure information of the metal portion and structure information of the dielectric portion with precision;

deriving simultaneous equations according to the moment method based on the structure information of the electric circuit device input in the inputting, an electric current flowing through the metal portion and an equivalent electric current and an equivalent magnetic current flowing through the dielectric portion being set as unknowns in the simultaneous equations;

calculating the electric current, the equivalent electric current, and the equivalent magnetic current by solving the simultaneous equations derived in the deriving; and determining at least one of the electric field intensity and the magnetic field intensity radiated by the electric circuit device based on results obtained in the calculating.

7. The method according to claim 6, further including a step of outputting at least one of the electric field intensity and the magnetic field intensity in a graphic format.

8. The method according to claim 6, wherein the simultaneous equations are derived in consideration of an electric current suppressing effect generated by an inductive core attached to a cable contained in the electric circuit device.

9. The method according to claim 6, wherein when a wave reflected by a ground surface should be taken into account, the simultaneous equations are derived by generating a structure image for the wave and assuming for the structure image an electric current having same value and opposite direction to an electric current flowing in the electric circuit device.

10. The method according to claim 6, further including a step of dividing the structure of the electric circuit device into mesh form.

11. The method according to claim 10, wherein the simultaneous equations are derived based on the structure of the electric circuit device divided into the mesh form.

12. An electromagnetic field intensity calculating device for calculating an electromagnetic field intensity radiated by an electric circuit device based on a moment method, comprising:

input means for inputting structures of a printed circuit board, a cable, a lead, and a metal box included in the electric circuit device with precision;

deriving means for deriving simultaneous equations according to the moment method based on the structures input to the input means, electric currents flowing through the printed circuit board, the cable, the lead, and the metal box, and equivalent electric currents and equivalent magnetic currents flowing through dielectric portions of the printed circuit board, the cable, the lead, and the metal box being set as unknowns in the simultaneous equations;

calculating means for calculating the electric currents, the equivalent electric currents and the equivalent magnetic currents by solving the simultaneous equations derived by the deriving means; and computation means for calculating the electromagnetic field intensity radiated by the electric circuit device based on calculation results obtained by the calculating means.

* * * * *